(12) United States Patent
Saran et al.

(10) Patent No.: US 10,200,033 B2
(45) Date of Patent: *Feb. 5, 2019

(54) GENERIC RANDOMIZED MESH DESIGN

(71) Applicant: Atmel Corporation, Chandler, AZ (US)

(72) Inventors: Neerja Saran, Fremont, CA (US);
Heather Atkinson, Colorado Springs, CO (US); Kevan Doyle, Boulder, CO (US)

(73) Assignee: Atmel Corporation, Chandler, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 15/914,394

(22) Filed: Mar. 7, 2018

(65) Prior Publication Data
US 2018/0198446 A1    Jul. 12, 2018

Related U.S. Application Data

(63) Continuation of application No. 14/022,150, filed on Sep. 9, 2013.

(51) Int. Cl.
*H03K 17/96* (2006.01)
*G06F 3/044* (2006.01)

(52) U.S. Cl.
CPC ......... *H03K 17/9622* (2013.01); *G06F 3/044* (2013.01); *G06F 2203/04112* (2013.01); *H03K 2217/960755* (2013.01)

(58) Field of Classification Search
CPC .... H03K 17/9622; H03K 2217/960755; G06F 3/044; G06F 2203/04112
See application file for complete search history.

(56) References Cited

U.S. PATENT DOCUMENTS

| 7,663,607 | B2 | 2/2010 | Hotelling |
| 7,864,503 | B2 | 1/2011 | Chang |
| 7,875,814 | B2 | 1/2011 | Chen |

(Continued)

FOREIGN PATENT DOCUMENTS

| CN | 102902856 | 1/2013 |
| CN | 103902856 A | 1/2013 |
| WO | WO 2012/129247 A2 | 9/2012 |

OTHER PUBLICATIONS

U.S. Appl. No. 61/454,936, filed Mar. 21, 2011, Myers.

(Continued)

*Primary Examiner* — Abhishek Sarma
(74) *Attorney, Agent, or Firm* — Baker Botts L.L.P.

(57) ABSTRACT

In one embodiment, an apparatus may include a first mesh of conductive material covering an area corresponding to at least a portion of the touch sensor. The first mesh includes a number of mesh cells. Each of the mesh cells has a number of vertices. Each of the vertices has a substantially randomized location within an inner portion of one of a number of polygons. The polygons collectively and contiguously covers the area corresponding to at least a portion of the touch sensor. One or more dimensions of the polygons is based at least in part on a pre-determined distance threshold between one or more pairs of opposing vertices. The apparatus also includes a computer-readable non-transitory storage medium coupled to the touch sensor and embodying logic that is configured when executed to control the touch sensor.

20 Claims, 5 Drawing Sheets

(56) References Cited

U.S. PATENT DOCUMENTS

| | | |
|---|---|---|
| 7,920,129 B2 | 4/2011 | Hotelling |
| 8,031,094 B2 | 10/2011 | Hotelling |
| 8,031,174 B2 | 10/2011 | Hamblin |
| 8,040,326 B2 | 10/2011 | Hotelling |
| 8,049,732 B2 | 11/2011 | Hotelling |
| 8,179,381 B2 | 5/2012 | Frey |
| 8,217,902 B2 | 7/2012 | Chang |
| 2008/0309635 A1 | 12/2008 | Matsuo |
| 2009/0315854 A1 | 12/2009 | Matsuo |
| 2011/0124252 A1 | 5/2011 | Shimomura et al. |
| 2012/0162116 A1 | 6/2012 | Phiipp |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |
| 2012/0262412 A1 | 10/2012 | Guard et al. |
| 2013/0076612 A1 | 3/2013 | Myers |
| 2013/0113502 A1 | 5/2013 | Yilmaz |
| 2013/0189502 A1 | 7/2013 | Takahashi et al. |
| 2014/0055380 A1 | 2/2014 | Han |
| 2014/0172379 A1 | 6/2014 | Chang et al. |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
N. Saran et al., U.S. Appl. No. 14/022,150, Non-final Rejection, dated Oct. 26, 2015.
N. Saran et al., U.S. Appl. No. 14/022,150, Non-final Rejection Response, dated Feb. 26, 2016.
N. Saran et al., U.S. Appl. No. 14/022,150, Final Rejection, dated Jun. 9, 2016.
N. Saran et al., U.S. Appl. No. 14/022,150, RCE and Response, dated Sep. 9, 2016.
N. Saran et al., U.S. Appl. No. 14/022,150, Non-final Rejection, dated Sep. 20, 2016.
N. Saran et al., U.S. Appl. No. 14/022,150, Non-final Rejection Response, dated Dec. 20, 2016.
N. Saran et al., U.S. Appl. No. 14/022,150, Final Rejection, dated May 12, 2017.
N. Saran et al., U.S. Appl. No. 14/022,150, Final Rejection Response, dated Jul. 12, 2017.
N. Saran et al., U.S. Appl. No. 14/022,150, Non-final Rejection, dated Sep. 14, 2017.
N. Saran et al., U.S. Appl. No. 14/022,150, Non-final Rejection Response, dated Oct. 10, 2017.
N, Saran et al., U.S. Appl. No. 14/022,150, Notice of Allowance, dated Nov. 14, 2017.

GENERIC RANDOMIZED MESH DESIGN

RELATED APPLICATION

This application is a continuation under 35 U.S.C. § 120 of U.S. application Ser. No. 14/022,150, filed Sep. 9, 2013 and entitled Generic Randomized Mesh Design, incorporated herein by reference.

TECHNICAL FIELD

This disclosure generally relates to touch sensors.

BACKGROUND

An array of conductive drive and sense electrodes may form a mutual-capacitance touch sensor having one or more capacitive nodes. The mutual-capacitance touch sensor may have either a two-layer configuration or single-layer configuration. In a single-layer configuration, drive and sense electrodes may be disposed in a pattern on one side of a substrate. In such a configuration, a pair of drive and sense electrodes capacitively coupled to each other across a space or dielectric between electrodes may form a capacitive node.

In a single-layer configuration for a self-capacitance implementation, an array of vertical and horizontal conductive electrodes may be disposed in a pattern on one side of the substrate. Each of the conductive electrodes in the array may form a capacitive node, and, when an object touches or comes within proximity of the electrode, a change in self-capacitance may occur at that capacitive node and a controller may measure the change in capacitance as a change in voltage or a change in the amount of charge needed to raise the voltage to some pre-determined amount.

In a touch-sensitive display application, a touch screen may enable a user to interact directly with what is displayed on a display underneath the touch screen, rather than indirectly with a mouse or touchpad. A touch screen may be attached to or provided as part of, for example, a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch screen.

DESCRIPTION OF EXAMPLE EMBODIMENTS

Figure 1:
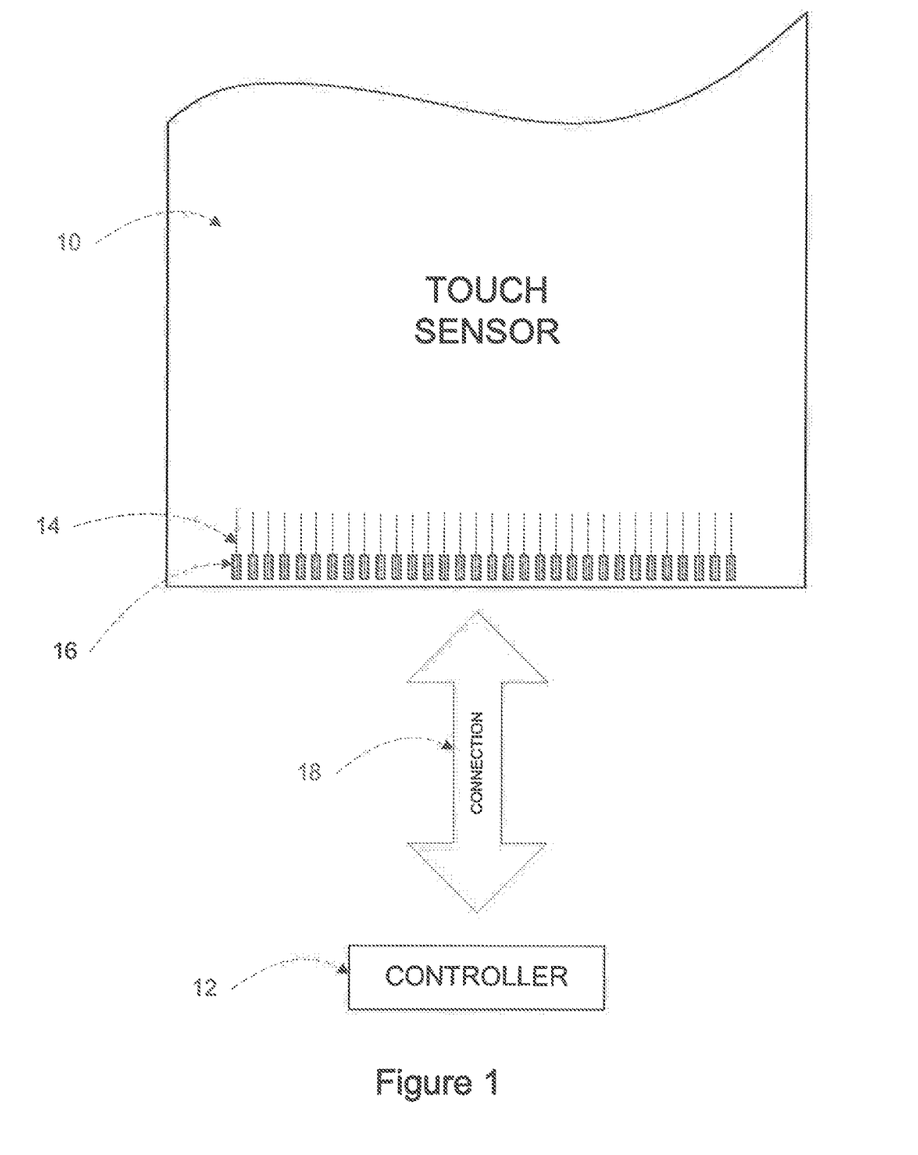
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of an optically clear conductive material, such as for example indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 μm or less and a width of approximately 10 μm or less. As another example, one or more portions of the conductive material may be silver or silver-based and similarly have a thickness of approximately 5 μm or less and a width of approximately 10 μm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other-instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 µm or less. As another example, the conductive material of tracks 14 may be silver or silver-based and have a width of approximately 100 µm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
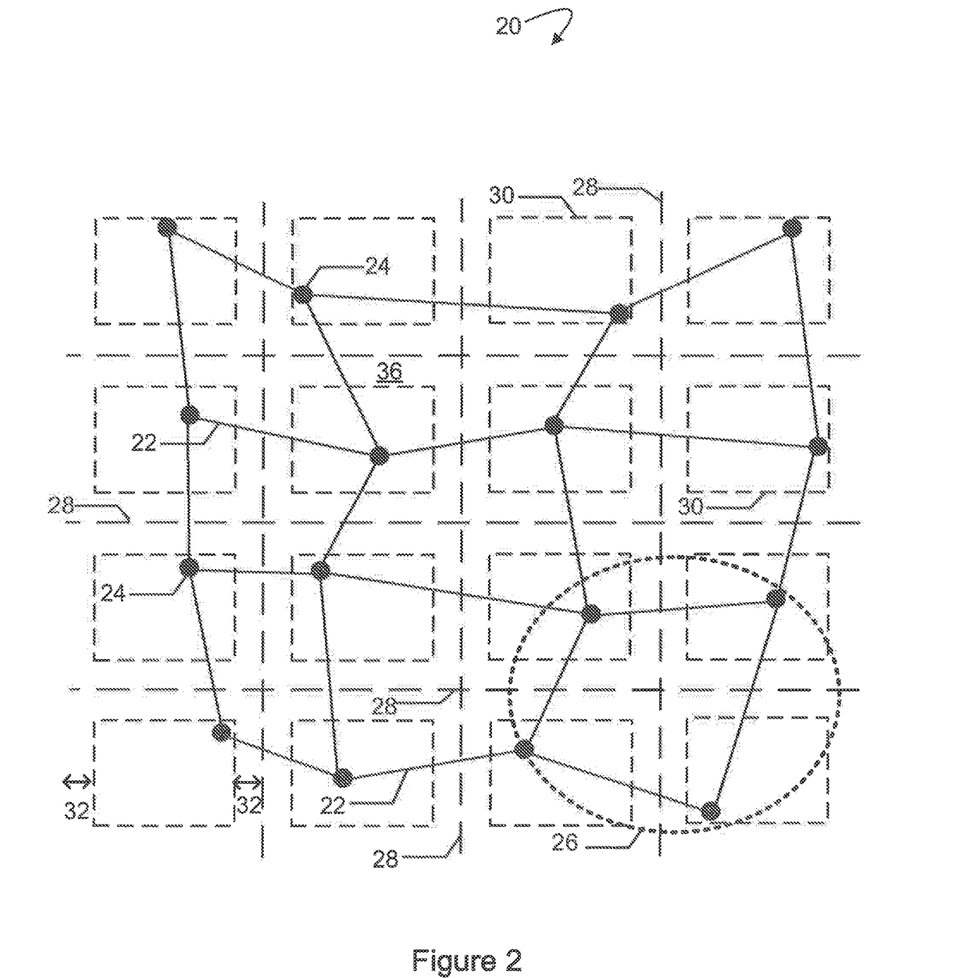
FIG. 2 illustrates an example area having example vertices with substantially randomized locations.

FIG. 2 illustrates an example portion of a touch sensor having example vertices with substantially randomized locations. Although this disclosure describes and illustrates a particular distribution of vertices, this disclosure contemplates any suitable distribution of vertices. Moreover, although this disclosure describes and illustrates particular vertices defining particular mesh cells or microfeatures in particular configurations, this disclosure contemplates any suitable vertices defining any suitable mesh cells or microfeatures in any suitable configuration. A touch sensor may be overlaid on a display to implement a touch-sensitive display device, as described below. As an example and not by way of limitation, the display underneath the touch sensor may be a liquid crystal display (LCD), a light-emitting diode (LED) display, an LED backlight LCD, an electrophoretic display, a plasma display, or other suitable display. Although this disclosure describes and illustrates a particular display configuration and display type, this disclosure contemplates any suitable device display configuration and display type independent of the specific details of the pixel arrangement, layout, configuration, or resolution of the display. Area 20 may correspond to a portion of a drive or sense electrode (or other element) of a touch sensor. In a touch sensor, mesh segments 22 connecting pairs of adjacent vertices 24 may correspond to fine lines of metal (such as for example copper, silver, or a copper- or silver-based material) or other conductive material with a thickness of approximately 1 µm or less and a width of approximately 5 µm or less. In particular embodiments, mesh cells 26 may be defined at least in part by two pairs of opposing vertices 24 and associated mesh segments 22. Although this disclosure describes and illustrates particular mesh cells with a particular number and configuration of vertices and mesh segments, this disclosure contemplates any suitable mesh cell with any suitable number of vertices and mesh segments. Moreover, this disclosure describes and illustrates mapping of the display relative to a particular coordinate system, this disclosure contemplates mapping the display relative to any suitable coordinate system, such as for example a polar coordinate system.

In particular embodiments, vertices 24 may be distributed throughout area 20 based at least in part on one or more dimensions of a display underneath the touch sensor. As an example and not by way of limitation, area 20 may be mapped to a Cartesian coordinate system with a first axis of the display corresponding to a horizontal axis and a second axis of the display corresponding to a vertical axis. In particular embodiments, area 20 may logically divided into a number of polygons 36 that collectively and contiguously cover area 20. As an example and not by way of limitation, polygons 36 may be rectangular-shaped regions based at least in part on the first and second axes of the display. Furthermore, a number of the rectangular-shaped regions along the first axis may be determined based at least in part on the dimension of the display along the first axis and a number of the rectangular-shaped regions along the second axis may be determined based at least in part on the dimension of the display along the second axis. As illustrated in the example of FIG. 2, the rectangular-shaped regions are illustrated by lines 28. In particular embodiments, polygons 36 may include an inner portion 30. Lines 28 and inner portions 30 do not correspond to any conductive or other material in the touch sensor. In particular embodiments, the one or more dimensions of polygons 36 defined by lines 28 may be determined based at least in part on a pre-determined minimum distance threshold $D_{th}$ between each pair of opposing vertices 24. A dimension or length of polygons 36 along the first axis of the display may be approximated by the following equation:

$$\text{Length} = \sqrt{\frac{D_{th}^2}{2}} \quad (1)$$

$D_{th}$ is the pre-determined minimum distance threshold between opposing vertices 24. As an example and not by way of limitation, for a pre-determined minimum distance threshold between opposing vertices 24 of 300 μm for an example single-sided touch sensor implementation, the length of polygons 36 defined by lines 28 along the first axis calculated from equation (1) may be 212 μm. Although this disclosure describes and illustrates an area of the touch sensor covered by particularly shaped polygons, this disclosure contemplates an area of the touch sensor covered by any suitably shaped polygons. Moreover, this disclosure describes and illustrates distributing vertices of the conductive mesh within particularly shaped inner portions, this disclosure contemplates distributing vertices of the conductive mesh within any suitably shaped inner portions.

Vertices 24 of mesh cells 26 may be arranged in a substantially randomized pattern that may reduce the occurrence of repeating patterns or frequencies among mesh segments 22, which may in turn reduce the occurrence of moiré patterns with respect to the display visible through area 20. In particular embodiments, each vertex 24 may have an associated inner portion 30 substantially centered within each polygon 36 of area 20. One or more dimensions of inner portions 30 may be determined based at least in part of one or more dimensions of an display underneath area 20. Furthermore, one or more dimensions of inner portions 30 may additionally be determined at least in part on a pre-determined randomization factor. As an example and not by way of limitation, the dimension of inner portions 30 along the first axis of the display may be approximated by the following equation:

$$\text{Spacing} = \frac{(1 - \text{randomization}) \times \text{length}}{2} \quad (2)$$

Spacing 32 is a subtracted amount of the length of polygons 36 that defines a dimension of inner portions 30, randomization is a pre-determined percentage of each polygon 36 allocated for each inner portion 30, and length is a dimension of polygons 36 that may be calculated as described above in equation (1). Continuing the example described above, for calculated value of length of 212 and a randomization of 0.25, spacing 32 calculated from equation (2) is 80 μm and a dimension of each inner portion 30 along the first axis is then 52 μm. The dimension of each inner portion 30 along the second axis may be calculated in a similar fashion. In particular embodiments, a location of each vertex 24 may be substantially randomly distributed within each inner portion 30. Furthermore, mesh segments 22 of conductive material may couple adjacent pairs of vertices 24.

In particular embodiments, one or more vertices 24 may be relocated to another randomized location within inner portion 30 in response to determining mesh segment 22 coupling a pair of vertices 24 is perpendicular to one or more pixels of the display. Furthermore, a vertex 24 may moved to another substantially random location within its associated inner portion 30 in response to determining whether mesh segment 22 coupling a pair of vertices 24 may be perpendicular to one or more pixels of the display as a result of a pre-determined rotation of the conductive mesh, as described below. In particular embodiments, vertices 24 may include one or more segments of conductive material that are substantially orthogonal to each other. As an example and not by way of limitation, vertices 24 may include a "cross" of conductive material that couples to mesh segments 22 to vertices 24 at a substantially 90° angle. In particular embodiments, the conductive mesh formed with vertices 24 and mesh segments 22 may be rotated by a pre-determined amount relative to the first or second axes of the display.

Figure 3:
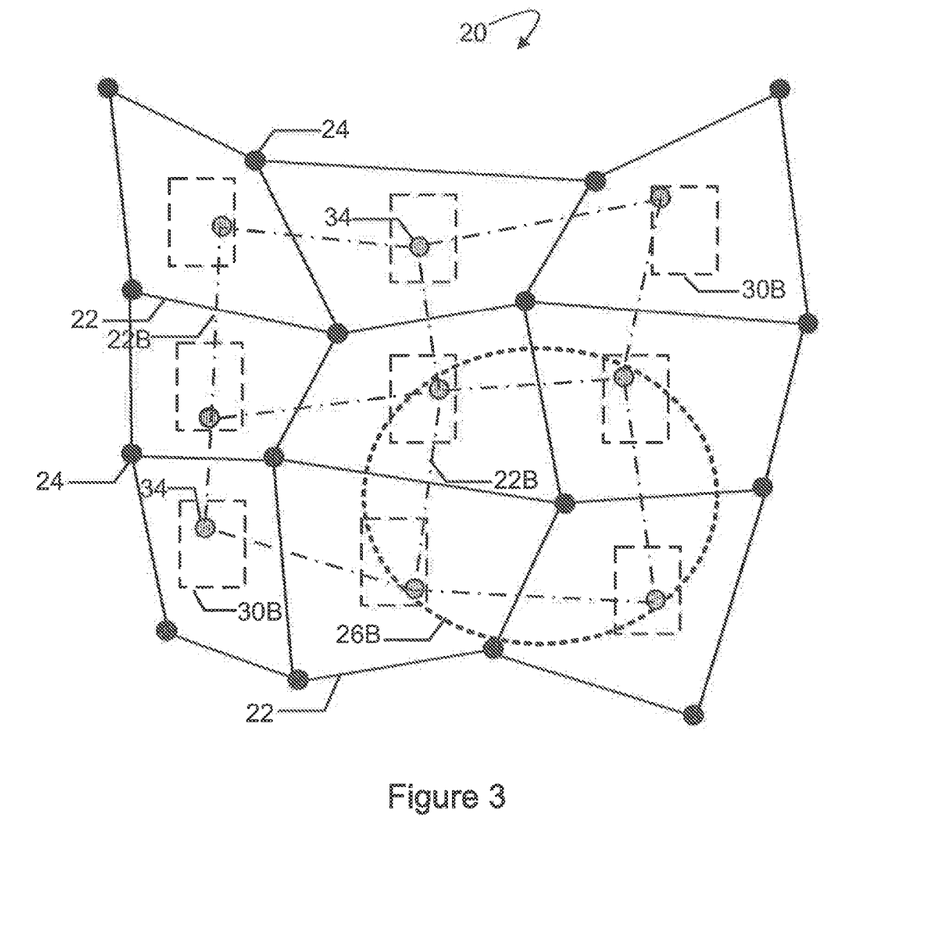
FIG. 3 illustrates an example dual-layer mesh with example vertices having substantially randomized locations.

FIG. 3 illustrates an example dual-layer mesh pattern with substantially randomized vertices. The example of FIG. 2 illustrates a single-sided implementation, but this disclosure contemplates any suitable n-sided implementation and is not limited to a singled-sided implementation. As described above, area 20 may correspond to a portion of a drive or sense electrode (or other element) of a touch sensor. In particular embodiments, a dual-layer mesh pattern over area 20 may include a second mesh of conductive material separated from a first mesh of conductive material at least by a thickness of a dielectric layer. As an example and not by way of limitation, a first conductive mesh may be formed on a first substrate and a second conductive mesh may be formed on a second substrate. As another example, the first and second conductive meshes may be formed on a surface of a substrate with a layer of dielectric material at locations where one or more mesh segments of the second conductive mesh overlap a mesh segment of the first conductive mesh. Furthermore, the first conductive mesh may correspond to at least a portion of a drive electrode and the second conductive mesh may correspond to at least a portion of a sense electrode of a touch sensor or vice versa.

In particular embodiments, one or more vertices 34, of the second conductive mesh may be distributed based at least in part on the location of mesh cells of the first conductive mesh. As an example and not by way of limitation, the distribution of vertices 34 of the second conductive mesh may be based at least in part on a centroid of mesh cells of the first conductive mesh defined by vertices 24 as illustrated in the example of FIG. 3. As described above, each vertex 34 of the second conductive mesh may have an associated inner portion 30B. As an example and not by way of limitation, the pre-determined minimum distance threshold between opposing vertices 24 may be 600 µm for an example dual-sided touch sensor implementation. Furthermore, one or more dimensions of inner portion 30B associated with vertices 34 may be calculated using equations (1) and (2) described above. In particular embodiments, a location of each vertex 34 may be substantially randomly distributed within inner portions 30B associated with each vertex 34 of the second conductive mesh. As described in regard to the example of FIG. 2, mesh segments 22B of conductive material may couple adjacent pairs of vertices 34 of the second conductive mesh. In particular embodiments, mesh cells 26B of the second conductive mesh may be formed by coupling adjacent pairs of vertices 34 with one or more mesh segments 22B that overlap a mid-point location of a mesh segment of the first conductive mesh. As described above, the conductive mesh of area 20 including the first and second conductive meshes may be rotated by a pre-determined amount relative to the first or second axes of the display. As an example and not by way of limitation, the first and second conductive meshes may be rotated by approximately 30° relative to the first or second axes of the display.

Figure 4:
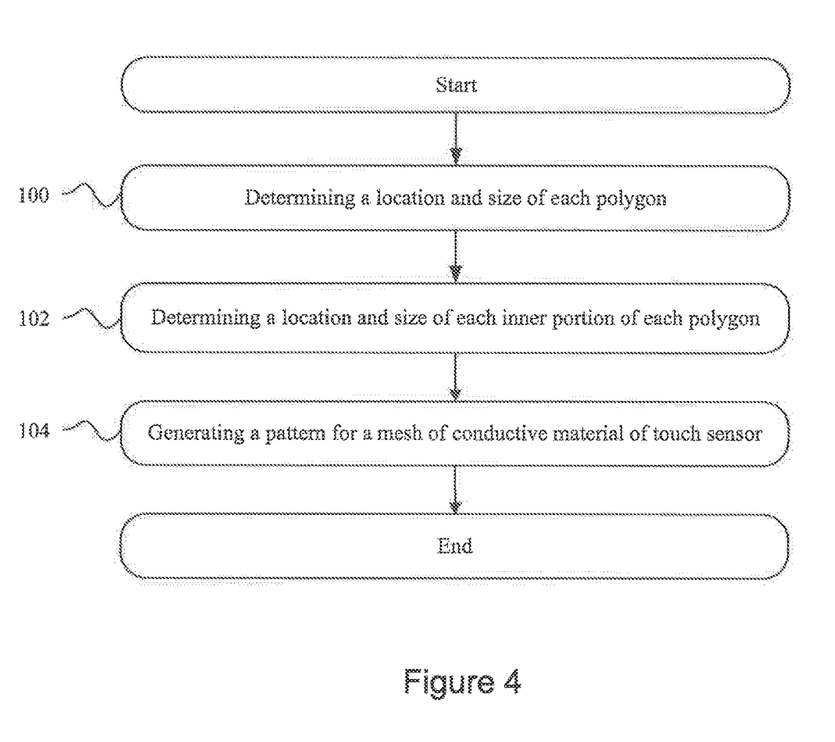
FIG. 4 illustrates an example method for designing a conductive mesh with randomized vertices.

FIG. 4 illustrates an example method for designing a conductive mesh with randomized vertices. The method may start at step 100, where a computing device may determining a location and size of each of a number of polygons. In particular embodiments, the polygons collectively and contiguously cover the area corresponding to at least a portion of a touch sensor. In particular embodiments, one or more dimensions of the polygons is based at least in part on a pre-determined distance threshold between one or more pairs of opposing vertices. At step 102, the computing device may determine a location and size of each of an inner portion of each of the polygons. At step 104, the computing device may generate a pattern for a mesh of conductive material of a touch sensor at least in part by determining a number of vertices of a plurality of mesh cells of the mesh of conductive material, at which point the method may end. In particular embodiments, each of the vertices may have a substantially randomized location within an inner portion of one of the polygons. Although this disclosure describes and illustrates particular steps of the method of FIG. 4 as occurring in a particular order, this disclosure contemplates any suitable steps of the method of FIG. 4 occurring in any suitable order. Particular embodiments may repeat one or more steps of the method of FIG. 4, where appropriate. Moreover, although this disclosure describes and illustrates an example method for designing a conductive mesh with randomized vertices including the particular steps of the method of FIG. 4, this disclosure contemplates any suitable method for voltage driven self-capacitance measurements including any suitable steps, which may include all, some, or none of the steps of the method of FIG. 4, where appropriate. Moreover, although this disclosure describes and illustrates particular components carrying out particular steps of the method of FIG. 4, this disclosure contemplates any suitable combination of any suitable components carrying out any suitable steps of the method of FIG. 4.

Figure 5:
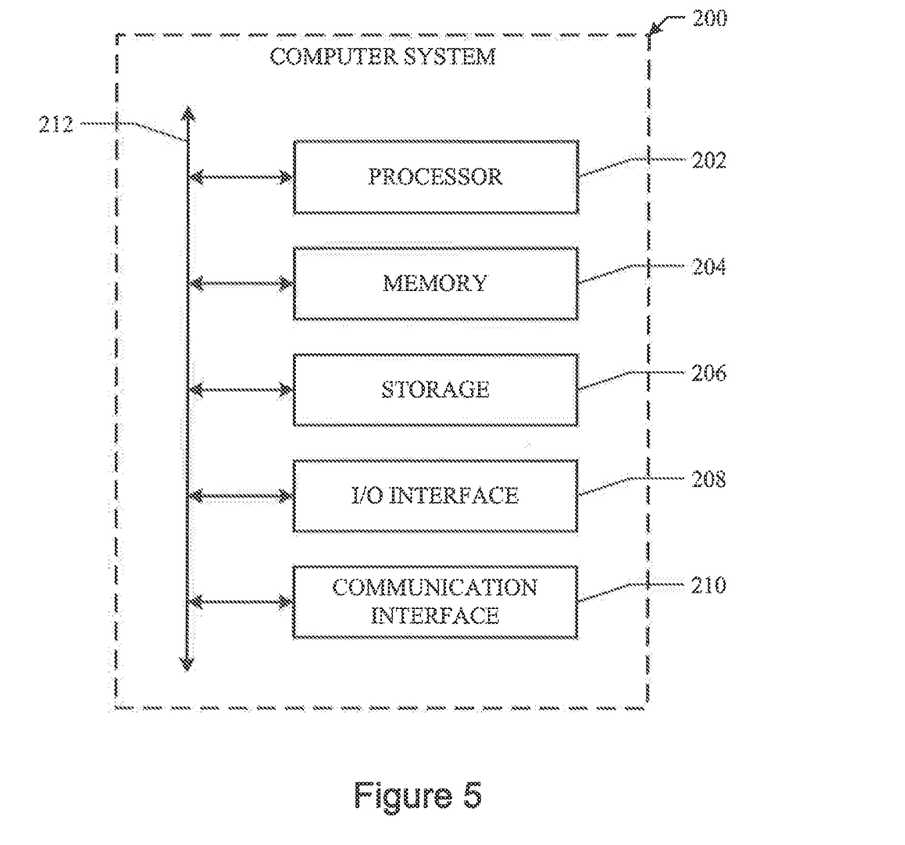
FIG. 5 illustrates an example computer system.

FIG. 5 illustrates an example computer system 200. In particular embodiments, one or more computer systems 200 perform one or more steps of one or more methods described or illustrated herein. In particular embodiments, one or more computer systems 200 provide functionality described or illustrated herein. In particular embodiments, software running on one or more computer systems 200 performs one or more steps of one or more methods described or illustrated herein or provides functionality described or illustrated herein. Particular embodiments include one or more portions of one or more computer systems 200. Herein, reference to a computer system may encompass a computing device, and vice versa, where appropriate. Moreover, reference to a computer system may encompass one or more computer systems, where appropriate.

This disclosure contemplates any suitable number of computer systems 200. This disclosure contemplates computer system 200 taking any suitable physical form. As example and not by way of limitation, computer system 200 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 200 may include one or more computer systems 200; be unitary or distributed; span multiple locations; span multiple machines; span multiple data centers; or reside in a cloud, which may include one or more cloud components in one or more networks. Where appropriate, one or more computer systems 200 may perform without substantial spatial or temporal limitation one or more steps of one or more methods described or illustrated herein. As an example and not by way of limitation, one or more computer systems 200 may perform in real time or in batch mode one or more steps of one or more methods described or illustrated herein. One or more computer systems 200 may perform at different times or at different locations one or more steps of one or more methods described or illustrated herein, where appropriate.

In particular embodiments, computer system 200 includes a processor 202, memory 204, storage 206, an input/output (I/O) interface 208, a communication interface 210, and a bus 212. Although this disclosure describes and illustrates a particular computer system having a particular number of particular components in a particular arrangement, this disclosure contemplates any suitable computer system having any suitable number of any suitable components in any suitable arrangement.

In particular embodiments, processor 202 includes hardware for executing instructions, such as those making up a computer program. As an example and not by way of limitation, to execute instructions, processor 202 may retrieve (or fetch) the instructions from an internal register, an internal cache, memory 204, or storage 206; decode and execute them; and then write one or more results to an internal register, an internal cache, memory 204, or storage 206. In particular embodiments, processor 202 may include one or more internal caches for data, instructions, or addresses. This disclosure contemplates processor 202 including any suitable number of any suitable internal caches, where appropriate. As an example and not by way of limitation, processor 202 may include one or more instruction caches, one or more data caches, and one or more translation lookaside buffers (TLBs). Instructions in the instruction caches may be copies of instructions in memory 204 or storage 206, and the instruction caches may speed up retrieval of those instructions by processor 202. Data in the data caches may be copies of data in memory 204 or storage 206 for instructions executing at processor 202 to operate on; the results of previous instructions executed at processor 202 for access by subsequent instructions executing at processor 202 or for writing to memory 204 or storage 206; or other suitable data. The data caches may speed up read or write operations by processor 202. The TLBs may speed up virtual-address translation for processor 202. In particular embodiments, processor 202 may include one or more internal registers for data, instructions, or addresses. This disclosure contemplates processor 202 including any suitable number of any suitable internal registers, where appropriate. Where appropriate, processor 202 may include one or more arithmetic logic units (ALUs); be a multi-core processor; or include one or more processors 202. Although this disclosure describes and illustrates a particular processor, this disclosure contemplates any suitable processor.

In particular embodiments, memory 204 includes main memory for storing instructions for processor 202 to execute or data for processor 202 to operate on. As an example and not by way of limitation, computer system 200 may load instructions from storage 206 or another source (such as, for example, another computer system 200) to memory 204. Processor 202 may then load the instructions from memory 204 to an internal register or internal cache. To execute the instructions, processor 202 may retrieve the instructions from the internal register or internal cache and decode them. During or after execution of the instructions, processor 202 may write one or more results (which may be intermediate or final results) to the internal register or internal cache. Processor 202 may then write one or more of those results to memory 204. In particular embodiments, processor 202 executes only instructions in one or more internal registers or internal caches or in memory 204 (as opposed to storage 206 or elsewhere) and operates only on data in one or more internal registers or internal caches or in memory 204 (as opposed to storage 206 or elsewhere). One or more memory buses (which may each include an address bus and a data bus) may couple processor 202 to memory 204. Bus 212 may include one or more memory buses, as described below. In particular embodiments, one or more memory management units (MMUs) reside between processor 202 and memory 204 and facilitate accesses to memory 204 requested by processor 202. In particular embodiments, memory 204 includes random access memory (RAM). This RAM may be volatile memory, where appropriate Where appropriate, this RAM may be dynamic RAM (DRAM) or static RAM (SRAM). Moreover, where appropriate, this RAM may be single-ported or multi-ported RAM. This disclosure contemplates any suitable RAM. Memory 204 may include one or more memories 204, where appropriate. Although this disclosure describes and illustrates particular memory, this disclosure contemplates any suitable memory.

In particular embodiments, storage 206 includes mass storage for data or instructions. As an example and not by way of limitation, storage 206 may include a hard disk drive (HDD), a floppy disk drive, flash memory, an optical disc, a magneto-optical disc, magnetic tape, or a Universal Serial Bus (USB) drive or a combination of two or more of these. Storage 206 may include removable or non-removable (or fixed) media, where appropriate. Storage 206 may be internal or external to computer system 200, where appropriate. In particular embodiments, storage 206 is non-volatile, solid-state memory. In particular embodiments, storage 206 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 206 taking any suitable physical form. Storage 206 may include one or more storage control units facilitating communication between processor 202 and storage 206, where appropriate. Where appropriate, storage 206 may include one or more storages 206. Although this disclosure describes and illustrates particular storage, this disclosure contemplates any suitable storage.

In particular embodiments, I/O interface 208 includes hardware, software, or both, providing one or more interfaces for communication between computer system 200 and one or more I/O devices. Computer system 200 may include one or more of these I/O devices, where appropriate. One or more of these I/O devices may enable communication between a person and computer system 200. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 208 for them. Where appropriate, I/O interface 208 may include one or more device or software drivers enabling processor 202 to drive one or more of these I/O devices. I/O interface 208 may include one or more I/O interfaces 208, where appropriate. Although this disclosure describes and illustrates a particular I/O interface, this disclosure contemplates any suitable I/O interface.

In particular embodiments, communication interface 210 includes hardware, software, or both providing one or more interfaces for communication (such as, for example, packet-based communication) between computer system 200 and one or more other computer systems 200 or one or more networks. As an example and not by way of limitation, communication interface 210 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 210 for it. As an example and not by way of limitation, computer system 200 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 200 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 200 may include any suitable communication interface 210 for any of these networks, where appropriate. Communication interface 210 may include one or more communication interfaces 210, where appropriate. Although this disclosure describes and illustrates a particular communication interface, this disclosure contemplates any suitable communication interface.

In particular embodiments, bus 212 includes hardware, software, or both coupling components of computer system 200 to each other. As an example and not by way of limitation, bus 212 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 212 may include one or more buses 212, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus comprising:
a touch sensor comprising a first mesh of conductive material covering an area corresponding to at least a portion of the touch sensor, wherein the area is logically divided into a plurality of polygons of the first mesh that collectively contiguously cover the area, the first mesh comprising a plurality of mesh cells that are each defined by a plurality of vertices, each of the vertices having a substantially randomized location within a respective inner polygon of the first mesh, each inner polygon being within a respective one of a plurality of polygons of the first mesh, one or more dimensions of the polygons of the first mesh being based at least in part on a pre-determined distance threshold between one or more pairs of opposing vertices;
each of the inner polygons of the first mesh spaced from adjacent inner polygons of the first mesh along a first axis by a distance based at least in part on a pre-determined randomization factor and on the one or more dimensions of the polygons; and
a computer-readable non-transitory storage medium coupled to the touch sensor and embodying logic that is configured when executed to control the touch sensor.

2. The apparatus of claim 1, wherein one or more of the dimensions of the inner polygons is determined at least in part on a pre-determined randomization value.

3. The apparatus of claim 1, wherein a number of vertices along a first axis of a display underneath the touch sensor is determined at least in part by a dimension of the display along the first axis.

4. The apparatus of claim 3, wherein a number of vertices along a second axis of the display is determined at least in part by a dimension of the display along the second axis, wherein the second axis is perpendicular to the first axis.

5. The apparatus of claim 3, wherein a segment of conductive material coupling a pair of adjacent vertices are non-orthogonal relative to one or more pixels of the display.

6. The apparatus of claim 5, wherein each vertex comprises conductive material coupling the segment of conductive material to the vertex at a substantially 90° angle.

7. The apparatus of claim 3, wherein the first mesh is rotated by a pre-determined angle relative to the first axis.

8. The apparatus of claim 1, wherein the touch sensor further comprises a second mesh of conductive material, the second mesh comprising a plurality of mesh cells that each have a plurality of vertices, each of the vertices being located within an inner portion within each mesh cell of the first mesh, the second mesh being separated from the first mesh by a thickness of a dielectric layer.

9. A touch sensor comprising:
a first mesh of conductive material covering an area corresponding to at least a portion of the touch sensor, the area is logically divided into a plurality of polygons of the first mesh that collectively contiguously cover the area, the first mesh comprising a plurality of mesh cells;
each of the mesh cells being defined by a plurality of vertices;
each of the vertices having a substantially randomized location within a respective inner polygon of the first mesh, each inner polygon being within a respective one of a plurality of polygons of the first mesh, one or more dimensions of the polygons of the first mesh being based at least in part on a pre-determined distance threshold between one or more pairs of opposing vertices; and
each of the inner polygons of the first mesh spaced from adjacent inner polygons of the first mesh along a first axis by a distance based at least in part on a pre-determined randomization factor and on the one or more dimensions of the polygons.

10. The touch sensor of claim 9, wherein one or more of the dimensions of the inner polygons is determined at least in part on a pre-determined randomization value.

11. The touch sensor of claim 9, wherein a number of vertices along a first axis of a display underneath the touch sensor is determined at least in part by a dimension of the display along the first axis.

12. The touch sensor of claim 11, wherein a number of vertices along a second axis of the display is determined at least in part by a dimension of the display along the second axis, wherein the second axis is perpendicular to the first axis.

13. The touch sensor of claim 11, wherein a segment of conductive material coupling a pair of adjacent vertices are non-orthogonal relative to one or more pixels of the display.

14. The touch sensor of claim 13, wherein each vertex comprises conductive material coupling the segment of conductive material to the vertex at a substantially 90° angle.

15. The touch sensor of claim 11, wherein the first mesh is rotated by a pre-determined angle relative to the first axis.

16. The touch sensor of claim 9, wherein the touch sensor further comprises a second mesh of conductive material, the second mesh comprising a plurality of mesh cells that each have a plurality of vertices, each of the vertices being located within an inner portion within each mesh cell of the first mesh, the second mesh being separated from the first mesh by a thickness of a dielectric layer.

17. A method comprising: by a computing device, determining a location and size of each of a plurality of polygons of a first conductive mesh, the polygons collectively and contiguously covering the area corresponding to at least a portion of a touch sensor, one or more dimensions of the polygons of the first conductive mesh being based at least in part on a pre-determined distance threshold between one or more pairs of opposing vertices;
   by the computing device, determining a location and size of each of an inner polygon of the first conductive mesh within a respective one of the polygons;
   by the computing device, generating a pattern for the first conductive mesh of a touch sensor at least in part by determining a plurality of vertices of a plurality of mesh cells of the first conductive mesh, each of the vertices having a substantially randomized location within a respective inner polygon of the first conductive mesh within the respective one of a plurality of polygons of the first conductive mesh; and
   each of the inner polygons of the first mesh spaced from adjacent inner polygons of the first mesh along a first axis by a distance based at least in part on a pre-determined randomization factor and on the one or more dimensions of the polygons.

18. The method of claim 17, wherein one or more of the dimensions of the inner polygons is determined at least in part on a pre-determined randomization value.

19. The method of claim 17, wherein a number of vertices along a first axis of a display underneath the touch sensor is determined at least in part by a dimension of the display along the first axis.

20. The method of claim 19, wherein a number of vertices along a second axis of the display is determined at least in part by a dimension of the display along the second axis, wherein the second axis is perpendicular to the first axis.

* * * * *